(12) United States Patent
Ostrem et al.

(10) Patent No.: US 6,977,602 B1
(45) Date of Patent: Dec. 20, 2005

(54) WIDE BAND DIGITAL TO ANALOG CONVERTERS AND METHODS, INCLUDING CONVERTERS WITH SELECTABLE IMPULSE RESPONSE

(75) Inventors: Geir Sigurd Ostrem, Colorado Springs, CO (US); Ajay Kuckreja, Boulder, CO (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/889,851

(22) Filed: Jul. 13, 2004

(51) Int. Cl.[7] ............................................... H03M 1/66
(52) U.S. Cl. ....................... 341/145; 341/141; 341/144
(58) Field of Search ................................ 341/136–154

(56) References Cited

U.S. PATENT DOCUMENTS

| | | | | |
|---|---|---|---|---|
| 3,877,023 | A | * | 4/1975 | Spicer et al. ............... 341/118 |
| 4,591,832 | A | * | 5/1986 | Fling et al. ................. 341/141 |
| 5,689,259 | A | * | 11/1997 | Ozguc ........................ 341/144 |
| 6,639,534 | B2 | * | 10/2003 | Khoini-Poorfard et al. . 341/144 |

OTHER PUBLICATIONS

Park, Sungkyung et al., "A Digital-to-Analog Converter Based on Differential-Quad Switching", IEEE Journal of Solid-State Circuits, Oct. 2002, pp. 1335-1338, vol. 37, No. 10.

* cited by examiner

Primary Examiner—Peguy JeanPierre
Assistant Examiner—Khai Nguyen
(74) Attorney, Agent, or Firm—Blakely, Sokoloff, Taylor & Zafman LLP

(57) ABSTRACT

Wide band CMOS digital to analog converters (DACs), including converters with selectable impulse response, using multiple DAC cores. The DAC cores operate on the same data at the DAC clock rate, but staggered in phase. Switches are used to switch the later part of the output time of each DAC core to the DAC output, otherwise to a dummy load. Thus each DAC conversion is comprised of a later part of each DAC core conversion, at least the first part of each DAC core conversion being ignored to allow each DAC core to settle before utilizing its output. Since the same switches and switching sequence is used on each DAC data conversion, the effects of switch imbalances are negated. Various embodiments are disclosed, including manipulation of the input to one of the DAC cores to selectively provide an NRZ, RZ and an RF response.

56 Claims, 5 Drawing Sheets

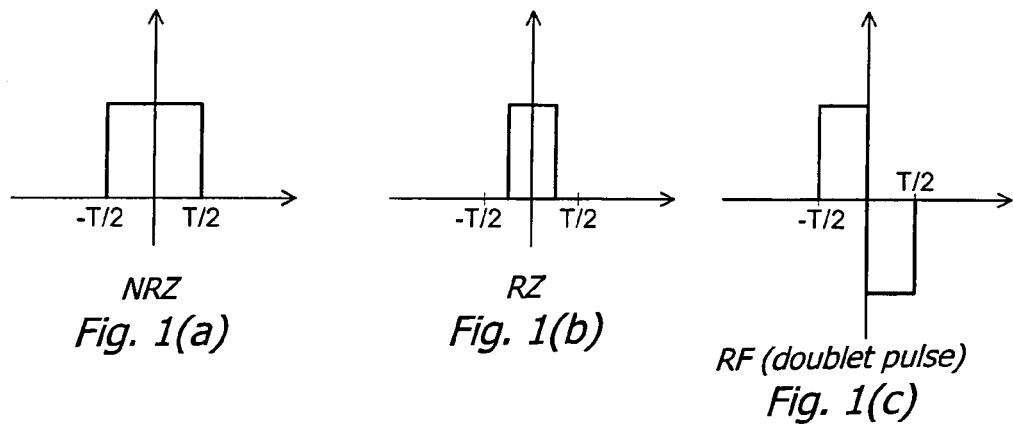
NRZ
Fig. 1(a)
RZ
Fig. 1(b)
RF (doublet pulse)
Fig. 1(c)
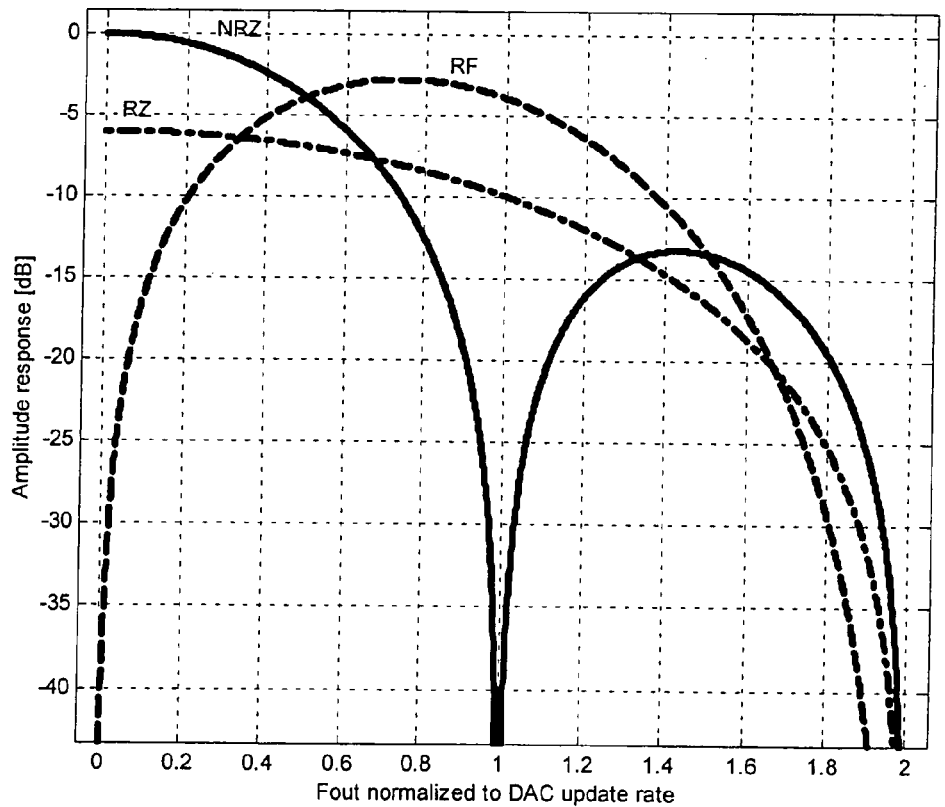
Fig. 2

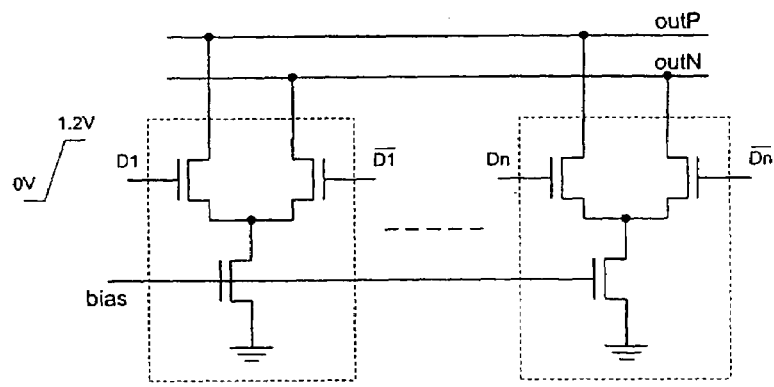
Fig. 3 (Prior Art)
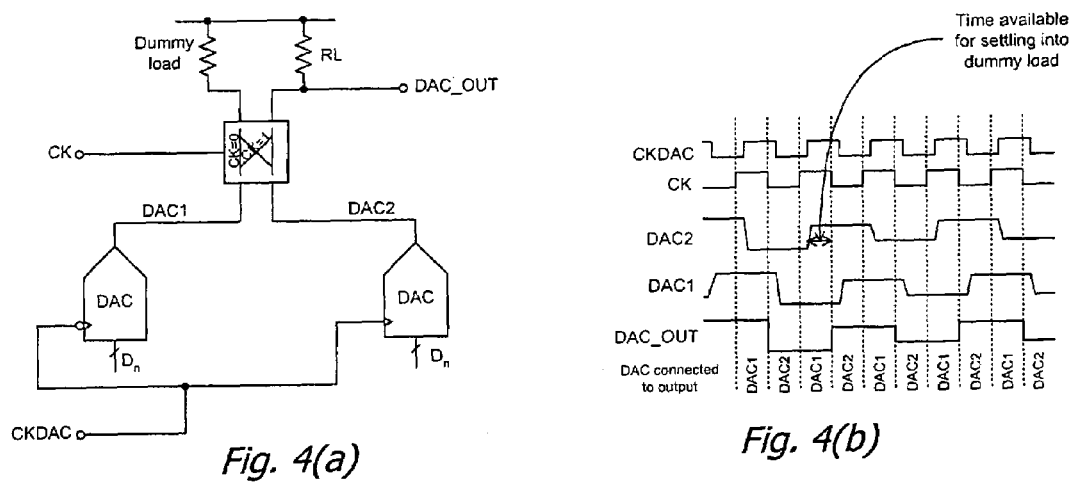
Fig. 4(a)
Fig. 4(b)

WIDE BAND DIGITAL TO ANALOG CONVERTERS AND METHODS, INCLUDING CONVERTERS WITH SELECTABLE IMPULSE RESPONSE

BACKGROUND OF THE INVENTION

1. Field of the Invention

The present invention relates to the field of digital to analog converters.

2. Prior Art

Current steering digital to analog converters (DACs) are well known in the prior art. In a current steering DAC, current sources are provided, with each current source being coupled to an output load, or to a power supply terminal or dummy load, dependent on the bit controlling the current steering switch controlling the destination of the respective current source. In a binary coded current steering DAC, the current sources are in a binary progression, each in proportion to the respective bit in the binary coded input, so that appropriate summing of the currents of the "active" bits provides an analog current output proportional to the value of the binary coded input. Passing the output current through a resistor provides an analog voltage proportional to the value of the binary coded input.

In a thermometer coded current steering DAC, assuming a binary coded input, the binary code is first converted to a thermometer code, so-called because of the nature of a thermometer code. In particular, an N bit binary code recodes to a $2^N$ thermometer code, with all bits up to particular level, dependent on the binary code input, being ones, or active so to speak, and all bits above that being zeros, or inactive. Each bit of the thermometer code is then used to control the steering of a respective one of $2^N$ equal current sources to the output, or to a power supply terminal or dummy load. Again, passing the output current through a resistor provides an analog voltage proportional to the value of the thermometer code, or in turn, proportional to the value of the binary coded input.

In a segmented DAC with an N bit binary code input, the input is broken up into two or more segments, such as, by way of example, two approximately equal size segments for the most significant bits and the least significant bits, each segment being converted to analog form, with the outputs being combined for an overall DAC output. Usually a segmented DAC uses thermometer coding for at least the most significant bits.

A current steering DAC may have a single ended or differential output. In the case of a differential output, the various current sources are steered to a positive output if the respective bit is active, or to a negative output if the respective bit is not active.

BRIEF DESCRIPTION OF THE DRAWINGS

FIGS. 1(a) through 1(c) present DAC impulse responses of NRZ, RZ and RF.

FIG. 2 presents curves illustrating the amplitude versus frequency for the DAC responses of FIGS. 1a through 1c.

FIG. 3 is a circuit diagram illustrating a well known exemplary current steering DAC topology.

FIGS. 4(a) and 4(b) are diagrams illustrating one embodiment of the present invention and an exemplary timing diagram for that embodiment, respectively.

DETAILED DESCRIPTION OF THE PREFERRED EMBODIMENTS

Figure 5:
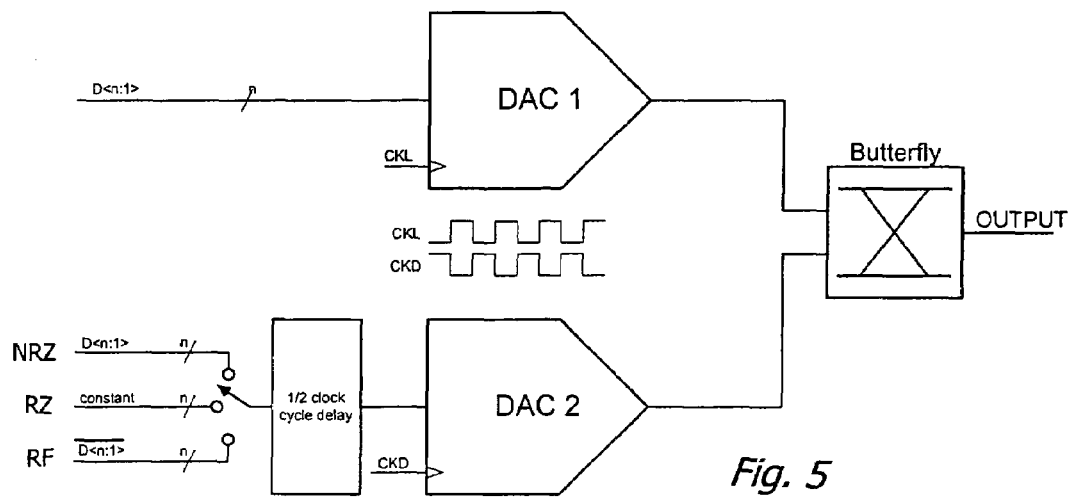
FIG. 5 is a diagram illustrating another embodiment of the present invention.

The present invention is a Nyquist digital to analog converter (DAC) suitable for digital to analog conversion of high frequency signals. Current steering DACs dominate high speed digital to analog (D/A) conversion. These converters are generally suited for D/A-conversion of baseband and intermediate frequency signals. Spurious free dynamic range and signal to noise ratio typically decreases too much with increasing output frequency to allow D/A conversion of RF signals. The present invention digital to analog converter extends the output frequency range of the DAC to radio frequencies (RF) by solving three problems:

1. Clock delay mismatches and switch delay mismatches cause spurious signals in the output of a DAC outputting a high frequency signal. The present invention architecture where the output data timing is determined by a single switch, can attenuate this effect and hence improve spectral purity. In the present invention, two DAC cores, each running at the DAC update rate, are used. Each DAC core provides the DAC output in a respective one half of the DAC clock cycle. The DAC cores are updated into a dummy load for half a clock cycle before being switched into the external load. This is achieved by routing the DAC outputs through a low distortion butterfly circuit. A single clock controls the butterfly, and thus the DAC-output timing. This eliminates errors caused by clock delay mismatches and switch delay mismatches in the DAC cores, resulting in improved high frequency distortion performance.

2. A DAC is mostly used to output a signal in the first Nyquist zone—from DC to half the DAC update rate. The DAC also outputs images in all other Nyquist zones—examples being the second Nyquist zone (the frequency range from half the DAC update rate to the DAC update rate) and the third Nyquist zone (from the DAC update rate to 1.5 times the DAC update rate). Due to the finite (non-zero) duration of the DAC impulse response, the frequency response of the DAC is attenuated at higher output frequencies. Most DACs have a non-return-to-zero (NRZ) impulse response as shown in FIG. 1(a). The frequency response of a DAC with NRZ impulse response is a sinc-function and is shown in FIG. 2. As is obvious from this Figure, the output power in the second and third Nyquist zones is attenuated, and the gain is not very flat. In this invention, the use of two DAC cores and a butterfly circuit allows simple implementation of three different impulse responses—non-return-to-zero (NRZ), return-to-zero (RZ), and doublet pulse (also called "RF-mode"), by trivial manipulation of input data. The impulse responses are shown in FIGS. 1(a) through 1(c), and the frequency responses in FIG. 2. As is obvious from FIG. 2, the RZ and doublet pulse impulse responses provide increased output power and improved gain flatness in the second and third Nyquist zones. The NRZ impulse response causes a high attenuation of the images in the second and third Nyquist zones—particularly at output frequencies close to the DAC update rate. The RZ response improves gain flatness in the second and third Nyquist zones. The RF (doublet pulse) impulse response concentrates more of the DAC output energy in the second and third Nyquist zones, and reduces the energy in the first Nyquist zone. Using GHz DAC update rates, the doublet pulse impulse response allows output of RF signals in the second and third Nyquist zones because, as is evident from FIG. 2, improved gain flatness and a higher output power is achievable in these Nyquist zones using the RF impulse response.

3. Fast steps at the outputs of a current steering DAC cause voltage pulses across output bond wire inductances, resulting in increased distortion at the DAC outputs. Integrated DAC termination resistors reduce the signal currents in the bond wires, and attenuate the voltage pulses on the DAC outputs caused by package and bond wire inductances when output current steps are applied. The resistors are self trimmed, to ensure gain accuracy and predictable impedance match to the load.

Embodiments of the present invention allow, by way of example, implementation of 10 bit and 12 bit, 2.5GSPS DACs, as well as digital downstream video up-converters. The present invention is also suited for use in interpolating/modulating DACs and direct digital synthesizer products. In one exemplary embodiment of a 12 bit DAC, a segmented DAC using 5-bit thermometer MSBs, followed by another 4-bit thermometer coded bits, and then 3-bit thermometer LSBS. Differential output DACs are used, with the exemplary current steering topology shown in FIG. 3. The bias sets the current of the various current sources, typically referenced to a bandgap reference. It should be noted however, that the present invention is directed to current steering DACs, no matter how implemented, and is not limited to 3 segment segmented DACs or for that matter, to thermometer code DACs. Also, while NMOS embodiments are specifically disclosed herein, the invention may be realized in PMOS form, or implemented in BiCMOS or bipolar processes, if desired. The CMOS circuits described herein may be implemented, by way of example, using a single oxide CMOS process or a dual oxide CMOS process.

Having outlined various aspects of preferred embodiments of the present invention, details of certain specific embodiments will now be presented. In particular, as shown in FIG. 4(a), a butterfly switch and two DAC cores are used to attenuate the effect of timing mismatches in DAC data switching. In accordance with the present invention, both DAC cores are running at the full DAC conversion rate. The DAC cores operate in a staggered fashion on the same input data, so that one DAC output sample consists of a "half-sample" output by one DAC core DAC1, followed by a "half-sample" output by the other DAC core DAC2. Each half sample is chosen to coincide with the second half of each DAC core output to allow that output to settle during the first half of the DAC core output. It should be noted that this is very different from the known technique of time interleaving, where different data are applied to the two DACs to double the conversion rate. In particular, in the known technique of time interleaving, each DAC runs at one half the DAC conversion rate, with the digital input signals in the input data stream being applied alternately between the two DACS, and the outputs of the DACs similarly alternately applied to the analog output of the system.

Referring again to FIG. 4(a), DAC1 and DAC2 both receive the same input data $D_n$ (not staggered input data as in interleaving), though the clock signal CKDAC to DAC1 is shifted 180° (inverted) with respect to the corresponding clock signal applied to DAC2. Thus the conversions in the two DAC cores will be shifted in time one half a DAC output sample time. The butterfly switch alternately selects the second half of the conversion time for each DAC core for steering the output of that DAC core to the output DAC_OUT as a DAC output sample, and at the same time steers the output of the other DAC core to the dummy load during the first half of the conversion time for that DAC core. Exemplary timing for this operation may be seen in FIG. 4(b).

Embodiments of the present invention may facilitate a user selection of impulse response to be used by manipulation of the input data. For instance, referring to FIG. 5, a diagram similar to that of FIG. 4(a) may be seen. In FIG. 5, a ½ clock cycle delay in the data input to DAC2 is expressly shown, such an actual or effective delay being implied in the foregoing description of the operation of FIG. 4(a). The various impulse responses may be selected by the following manipulation of the DAC input data:

1. NRZ: Non-inverted input data D<n:1> are applied to DAC1 and DAC2
2. RZ: Non-inverted input data D<n:1> are applied to DAC1. DAC2 is set to output a constant value (midscale)
3. RF: Non-inverted input data D<n:1> are applied to DAC1. Inverted input data $\overline{D<n:1>}$ are applied to DAC2.

Figure 6A:
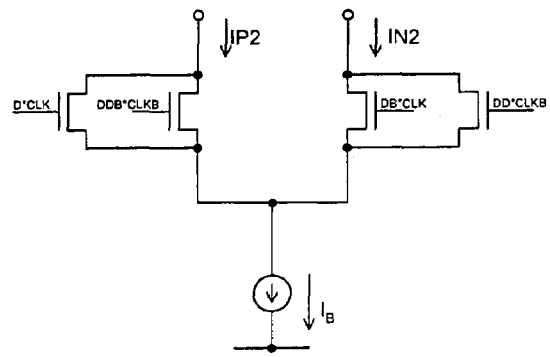
FIGS. 6(a) and 6(b) illustrate a switch and timing diagrams for the embodiment of FIG. 5 to provide a doublet pulse output.
Figure 6B:
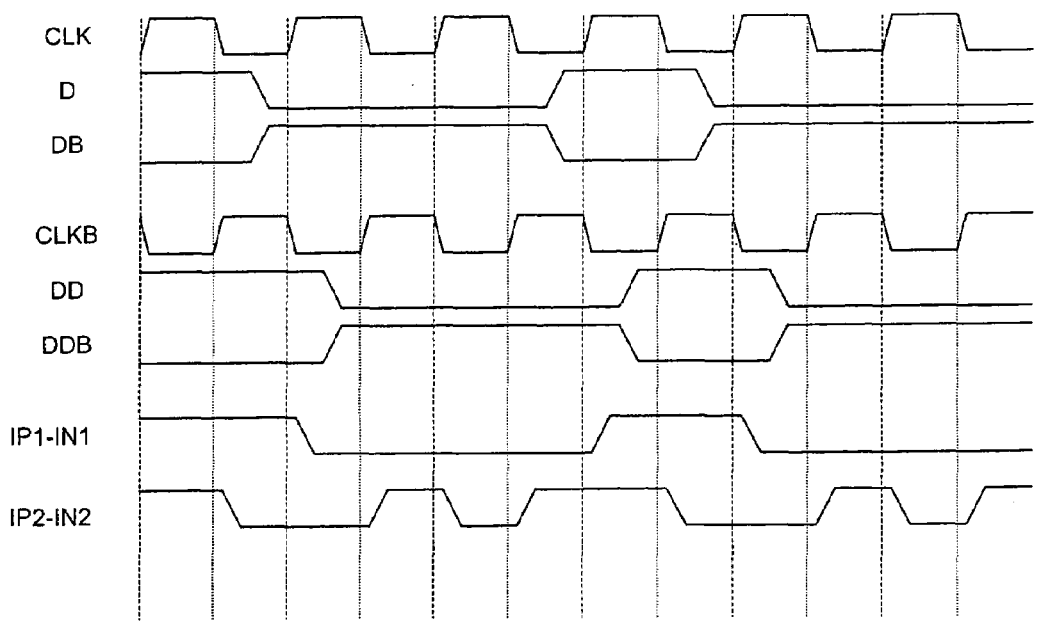

An alternative way of implementing the impulse response is to implement it in the current switches in DAC1 and DAC2, This can be done using a circuit as shown in FIG. 6(a), similar to differential quad switching as described in "A Digital-to-Analog Converter Based on Differential-Quad Switching" by S. Park et al, IEEE Journal of Solid State Circuits, Vol. 37, No. 10, October 2002. As shown in the timing diagram in FIG. 6(b), the doublet pulse impulse response can be realized by applying inverted data in one half the clock period.

Figure 7:
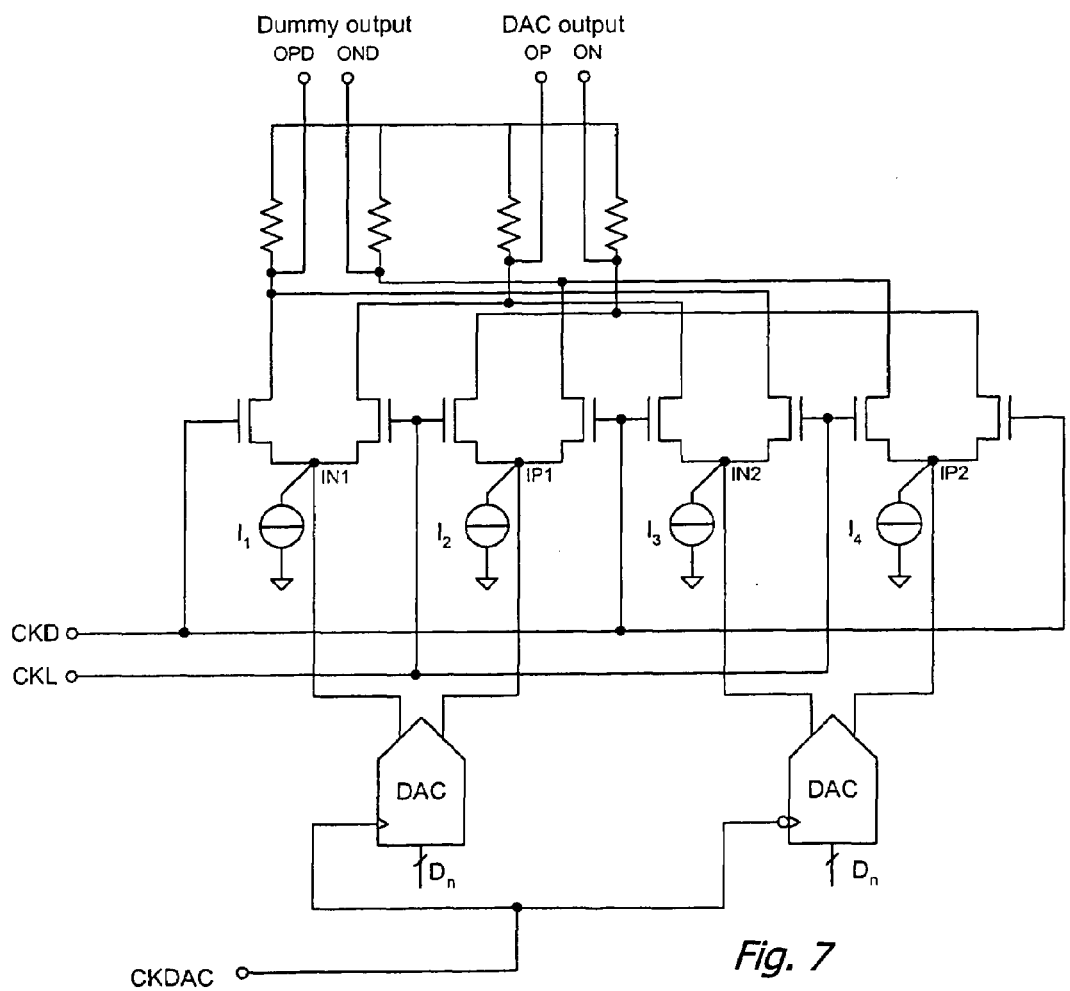
FIG. 7 presents a circuit diagram for a simplified butterfly switch implementation.

The butterfly switches may be implemented, by way of example, as shown in the simplified schematic of FIG. 7. The butterfly consists of four NMOS differential pairs. The DACs are connected to the common source nodes (IN1, IP1, IN2, IP2) of these differential pairs. (It is also possible to implement the butterfly switches using different types of transistors, including bipolar transistors if desired.) The clock signals (CKD, CKL) used in a simulation had a high cross point and 30 ps rise/fall times. The common source nodes of the differential pairs must settle quickly for RF use. If a DAC output current is low (or zero), the common source node impedance may become very high. This will cause the node to settle slowly. Therefore constant bias currents $I_1$–$I_4$ are added to keep the common source node impedances low enough to provide fast settling. These currents must be accurately matched in order for them to not introduce spurs as they are being switched, though this can be achieved by having them part of the current source array, and having them calibrated together with the DAC currents. The clock signals CKD (clock to the dummy loads) and CKL (clock to the output loads) are 180° out of phase, and alternately clock one of the DAC core differential outputs to the dummy loads while clocking the other DAC core differential outputs to the output loads.

Figure 8:
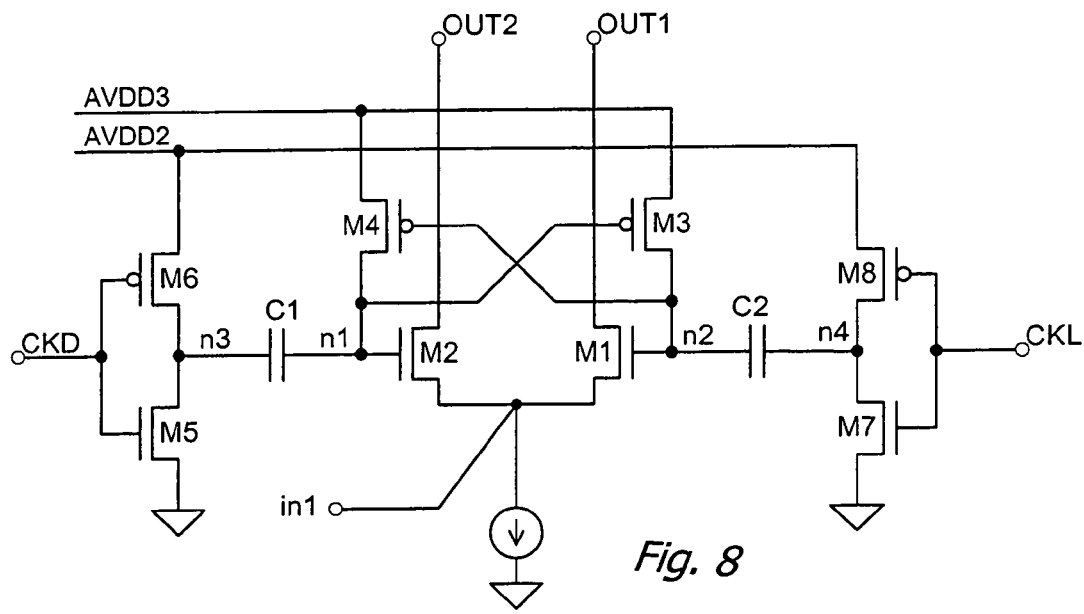
FIG. 8 presents a circuit diagram for a butterfly switch implementation using two power supplies.

In some embodiments, dual supply voltages are used in the DAC, as shown in FIG. 8 (e.g. VDD2=1.8V and VDD3= 3.3V). The clocks CKD and CKL driving the DAC cores are operating from VDD2. In order to turn on the butterfly switches properly, the clock high must be VDD3. Hence the clock must be level shifted. Level shifting the clocks using an active level shifter will introduce a delay that is dependent on process variations, supply voltage and temperature, making it difficult to control the delay between the DAC cores and the butterfly with sufficient (picosecond) accuracy. Therefore, the level shifting is done with capacitors as shown in FIG. 8. In this Figure, one of four switches (see FIG. 7) is shown. The main advantage of this implementation is that the delay is controlled to picosecond accuracy. A well controlled delay is critically important for GHz rate D/A conversion.

In the circuit of FIG. 8, complementary clocks are applied to nodes CKD and CKL. The input current from the DAC core is applied to node in1. Switch outputs are OUT1 and OUT2. The butterfly switch consists of transistors M1 and M2. Transistor M3 sets the level at node n2 to AVDD3 when n1 is pulled low (node n3 is at ground). In this case, node n4 is equal to the supply voltage AVDD2. Transistor M4 sets the level at node n1 to AVDD3 when n2 is pulled low (node n4 is at ground). In this case, node n3 is equal to the supply voltage AVDD2. These conditions establish and maintain the fixed voltage VC=AVDD3−AVDD2 across capacitors C1 and C2. The voltage at n3 and n4 swings between ground and AVDD2. Thus, the voltage swing at nodes n1 and n2 will be between AVDD3 and AVDD3−AVDD2. The implementation of the butterfly requires a dual oxide process, where transistors M1 through M4 must be implemented as thick oxide transistors for reliability if the supply voltage AVDD3 is higher than the safe operating voltage for transistors M5 through M8.

Figure 9:
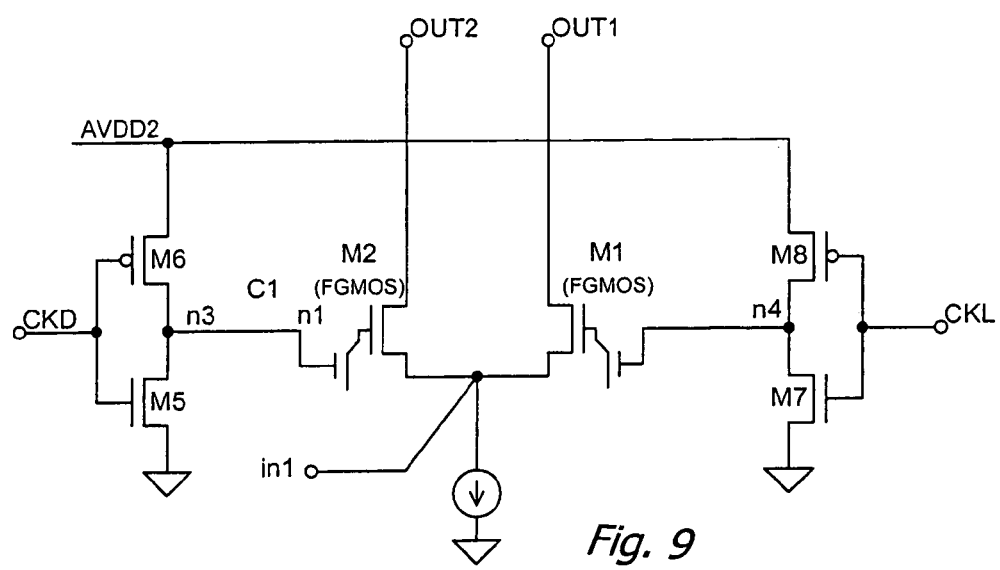
FIG. 9 presents a circuit diagram for an alternate butterfly switch implementation using one power supply and floating gate MOS (FGMOS) transistors.

As an alternative, Transistors M1 and M2 and capacitors C1 and C2 in the butterfly circuit described above may be replaced by two floating gate MOS (FGMOS) devices as shown in FIG. 9, with the level shifting being achieved by programming the threshold voltages of the floating gate devices to obtain the desired level shifting.

In the embodiments hereinbefore described, the DACs operate generally in accordance with FIGS. 4(a) and 4(b). Specifically, referring again to FIG. 4(a), it was stated that DAC1 and DAC2 both receive the same input data $D_n$ (not staggered input data as in interleaving), though the clock signal CKDAC to DAC1 is shifted 180° (inverted) with respect to the corresponding clock signal applied to DAC2. Thus the conversions in the two DAC cores will be shifted in time one half a DAC output sample time. The butterfly switch alternately selects the second half of the conversion time for each DAC core for steering the output of that DAC core to the output DAC_OUT as a DAC output sample, and at the same time steers the output of the other DAC core to the dummy load during the first half of the conversion time for that DAC core. Exemplary timing for this operation was illustrated in FIG. 4(b). However, these are not limitations of the present invention, as the butterfly switch may steer different proportions of the output times of the 2 DAC cores to the output DAC_OUT, and the clock signals may have a duty cycle other than 50%.

By way of a specific example, one can alter the response of the DAC (see FIG. 2) by using different proportions of the output times of the two DAC cores for the output DAC_OUT, particularly for RZ and RF operation (see FIG. 5). For instance, referring to FIGS. 4(a) and 4(b), assume the signal CKDAC has a duty cycle of X %, which may be different than 50%. The inverse signal will have a duty cycle of (100-X)%. Now with appropriate control of the butterfly switches, each DAC sample conversion output will be comprised of the last X % of the DAC conversion time of one DAC core, followed by the last (100-X)% of the conversion time of the other DAC core. Obviously as a consequence, the DAC core settling times will be changed to (100-X)% and X % of a conversion time, respectively.

Also the concept of the present invention could be extended to one or more additional DAC cores. If for instance, three DAC cores were used, operating on the same input data, but staggered in operation by 120°, and the butterfly switches provided as the DAC output, the last one third of the output time of each DAC core, then the settling time for each DAC core in comparison to a two DAC core configuration, similarly operating, would be increased from 50% of a sample time to 66% of a sample time, an increase of 33%, and therefore potentially an increase in the possible conversion rate for the DAC.

While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features as desired.

What is claimed is:

1. A DAC comprising:
first and second DAC cores operating on the same input data at a DAC clock rate, the operation of the second DAC core being delayed with respect to operation of the first DAC core; and,
a butterfly switch operative to couple an output of each DAC core to a DAC output during a later part of the DAC clock cycle of its operation;
whereby the DAC output for each digital to analog conversion of input data comprises the output of one DAC core during a later part of the DAC clock cycle of its operation followed by the output of the other DAC core during a later part of the DAC clock cycle of its operation.

2. The DAC of claim 1 wherein the butterfly switch couples an output of both DAC cores to the DAC output during the last part of the DAC clock cycle of their operation.

3. The DAC of claim 2 wherein the operation of the second DAC core is delayed one half a DAC clock cycle with respect to the operation of the first DAC core.

4. The DAC of claim 1 wherein the operation of the second DAC core is delayed one half a DAC clock cycle with respect to the operation of the first DAC core.

5. The DAC of claim 1 wherein the first and second DAC cores are current steering DAC cores.

6. The DAC of claim 5 wherein the butterfly switch switches the output of each DAC core to a dummy output when not switched to the DAC output.

7. The DAC of claim 1 wherein the first and second DAC cores are segmented DACs, each having at least the segment containing most significant bits of the input data thermometer coded.

8. The DAC of claim 1 wherein the first and second DAC cores are segmented DACs, each segment being thermometer coded.

9. The DAC of claim 1 wherein the butterfly switches comprise transistor pairs, each transistor having first and second electrodes and a control electrode, the conduction between the first and second electrodes being controlled by the voltage applied between the first electrode and the control electrode, each transistor pair having their first electrodes coupled together, to the output of a respective one of the DAC cores and to a respective constant current source, the control electrodes being coupled to a clock signal and the clock signal as inverted, the second electrodes of the transistor pairs being coupled to an external load and a dummy output.

10. The DAC of claim 9 wherein the DAC and DAC core outputs are differential outputs and the butterfly switches comprise four transistor pairs.

11. The DAC of claim 10 wherein the clock signal and the clock signal as inverted are referenced to a first power supply voltage and the butterfly switches are referenced to a second power supply voltage greater than the first power supply voltage, the clock signal and the clock signal as inverted each being capacitively coupled to respective control electrodes of each transistor pair, each transistor pair having first and second transistors, the butterfly switches each further having third and fourth transistors of opposite conductivity type from the first and second transistors, wherein the third transistor has its first terminal coupled to the control terminal of the first transistor, its second terminal coupled to the second power supply and its control terminal coupled to the control terminal of the second transistor, and the fourth transistor has its first terminal coupled to the control terminal of the second transistor, its second terminal coupled to the second power supply and its control terminal coupled to the control terminal of the first transistor.

12. The DAC of claim 10 wherein the clock signal and the clock signal as inverted are referenced to a first power supply voltage and the butterfly switches are referenced to a second power supply voltage greater than the first power supply voltage, the clock signal and the clock signal as inverted each being coupled to respective control electrodes of each transistor pair through floating gate devices programmed for level shifting of the clock signal and the clock signal as inverted.

13. The DAC of claim 1 wherein the DAC cores are CMOS DAC cores.

14. The DAC of claim 13 wherein the DAC cores are fabricated using a dual oxide CMOS process.

15. The DAC of claim 13 wherein the DAC cores are fabricated using a single oxide CMOS process.

16. The DAC of claim 1 wherein the DAC cores are fabricated using a BiCMOS process.

17. The DAC of claim 1 wherein the DAC cores are fabricated using a bipolar process.

18. The DAC of claim 1 wherein the DAC cores are NMOS DAC cores.

19. The DAC of claim 1 wherein the DAC cores are PMOS DAC cores.

20. A DAC comprising:
   first and second DAC cores operating at a DAC clock rate, the operation of the second DAC core being delayed with respect to the first DAC core;
   the first DAC core being coupled to receive input data to be converted;
   the second DAC core being configured to selectively receive as its input,
   a) the same input data to be converted as the first DAC core;
   b) a constant input; or,
   c) an inversion of the same input data to be converted as the first DAC core; and,
   a butterfly switch operative to couple an output of each DAC core to a DAC output during a later part of the DAC clock cycle of its operation;
   whereby the DAC output for each digital to analog conversion of input data comprises the output of one DAC core during the later part of the DAC clock cycle of its operation followed by the output of the other DAC core during the later part of the DAC clock cycle of its operation.

21. The DAC of claim 20 wherein the butterfly switch couples an output of each DAC core to the DAC output during the last part of the DAC clock cycle of its operation.

22. The DAC of claim 21 wherein the operation of the second DAC core is delayed one half a DAC clock cycle with respect to the operation of the first DAC core.

23. The DAC of claim 20 wherein the operation of the second DAC core is delayed one half a DAC clock cycle with respect to the operation of the first DAC core.

24. The DAC of claim 20 wherein the butterfly switch switches the output of each DAC core to a dummy output when not switched to the DAC output.

25. The DAC of claim 20 wherein the first and second DAC cores are segmented DACS, each having at least the segment containing most significant bits of the input data thermometer coded.

26. The DAC of claim 20 wherein the first and second DAC cores are segmented DACs, each segment being thermometer coded.

27. The DAC of claim 20 wherein the first and second DAC cores are current steering DAC cores.

28. The DAC of claim 20 wherein the butterfly switches comprise transistor pairs, each transistor having first and second electrodes and a control electrode, the conduction between the first and second electrodes being controlled by the voltage applied between the first electrode and the control electrode, each transistor pair having their first electrodes coupled together, to the output of a respective one of the DAC cores and to a respective constant current source, the control electrodes being coupled to a clock signal and the clock signal as inverted, the second electrodes of the transistor pairs being coupled to a DAC core output and a dummy output.

29. The DAC of claim 28 wherein the DAC and DAC core outputs are differential outputs and the butterfly switches comprise four transistor pairs.

30. The DAC of claim 29 wherein the clock signal and the clock signal as inverted are referenced to a first power supply voltage and the butterfly switches are referenced to a second power supply voltage greater than the first power supply voltage, the clock signal and the clock signal as inverted each being capacitively coupled to respective control electrodes of each transistor pair, each transistor pair having first and second transistors, the butterfly switches each further having third and fourth transistors of opposite conductivity type from the first and second transistors, wherein the third transistor has its first terminal coupled to the control terminal of the first transistor, its second terminal coupled to the second power supply and its control terminal coupled to the control terminal of the second transistor, and the fourth transistor has its first terminal coupled to the control terminal of the second transistor, its second terminal coupled to the second power supply and its control terminal coupled to the control terminal of the first transistor.

31. The DAC of claim 29 wherein the clock signal and the clock signal as inverted are referenced to a first power supply voltage and the butterfly switches are referenced to a second power supply voltage greater than the first power supply voltage, the clock signal and the clock signal as inverted each being coupled to respective control electrodes of each transistor pair through floating gate devices programmed for level shifting of the clock signal and the clock signal as inverted.

32. The DAC of claim 20 wherein the DAC cores are CMOS DAC cores.

33. The DAC of claim 32 wherein the DAC cores are fabricated using a dual oxide CMOS process.

34. The DAC of claim 32 wherein the DAC cores are fabricated using a single oxide CMOS process.

35. The DAC of claim 20 wherein the DAC cores are fabricated using a BiCMOS process.

36. The DAC of claim 20 wherein the DAC cores are fabricated using a bipolar process.

37. The DAC of claim 20 wherein the DAC cores are NMOS DAC cores.

38. The DAC of claim 20 wherein the DAC cores are PMOS DAC cores.

39. A method of digital to analog conversion comprising:
   a) presenting input data to be converted to the inputs of first and second DACs at a DAC clock rate;
   b) converting the input data presented to the input of a first DAC at the DAC clock rate;
   c) converting the input data presented to the input of the second DAC core at the DAC clock rate, the conversion in c) being delayed with respect to the conversion in b);
   whereby the first and second DACs each provide a DAC output for a time period equal to the time period of a DAC clock cycle, the DAC output of the second DAC being delayed in time with respect to the DAC output of the first DAC; and,
   d) providing as an analog output at the DAC clock rate for each data conversion, an output comprising the first DAC output during a later part of its output time period, followed by the second DAC output during a later part of its output time period.

40. The method of claim 39 wherein the butterfly switch couples an output of each DAC to the DAC output during the last part of the DAC clock cycle of its operation.

41. The DAC of claim 40 wherein the operation of the second DAC is delayed one half a DAC clock cycle with respect to the first DAC.

42. The DAC of claim 39 wherein the operation of the second DAC is delayed one half a DAC clock cycle with respect to the first DAC.

43. The method of claim 39 wherein the output of each DAC is the output of a current steering DAC.

44. The method of claim 43 wherein for each data conversion, the first and DAC outputs are coupled to dummy loads when not coupled to the DAC output.

45. The method of claim 39 wherein the first and second DACs are segmented DACs, each having at least the segment containing most significant bits of the input data thermometer coded.

46. The method of claim 39 wherein the first and second DACs are segmented DACS, each segment being thermometer coded.

47. A method of digital to analog conversion comprising:
   a) presenting input data to be converted to the input of a first DAC at a DAC clock rate;
   b) selectively presenting, as input data to the input of the second DAC at a DAC clock rate:
      i) the same input data to be converted as presented to the first DAC;
      ii) a constant input; or,
      iii) an inversion of the same input data to be converted as presented to the first DAC;
   c) converting the input data presented to the input of a first DAC at the DAC clock rate;
   d) converting the input data presented to the input of the second DAC core at the DAC clock rate, the conversion in d) being delayed with respect to the conversion in b);
   whereby the first and second DACs each provide a DAC output for a time period equal to the time period of a DAC clock cycle, the DAC output of the second DAC being delayed in time with respect to the DAC output of the first DAC; and,
   e) providing as an analog output at the DAC clock rate for each data conversion, the first DAC output during a later part of its output time period, followed by the second DAC output during a later part of its output time period.

48. The DAC of claim 47 wherein the butterfly switch couples an output of each DAC to the DAC output during the last part of the DAC clock cycle of its operation.

49. The DAC of claim 48 wherein the operation of the second DAC is delayed one half a DAC clock cycle with respect to the first DAC.

50. The DAC of claim 47 wherein the operation of the second DAC is delayed one half a DAC clock cycle with respect to the first DAC.

51. The method of claim 47 wherein the output of each DAC is the output of a current steering DAC.

52. The method of claim 51 wherein for each data conversion, the first and DAC outputs during the first half of their output time periods are coupled to dummy loads.

53. The method of claim 47 wherein the first and second DAC are segmented DACs, each having at least the segment containing most significant bits of the input data thermometer coded.

54. The method of claim 47 wherein the first and second DACs are segmented DACS, each segment being thermometer coded.

55. A DAC comprising:
   a plurality of DAC cores operating on the same input data at a DAC clock rate, the operation of the DAC cores being staggered in time; and,
   switches operative to couple an output of each DAC core to a DAC output during a later part of the DAC clock cycle of its operation;
   whereby the DAC output for each digital to analog conversion of input data comprises the output of one DAC core during a later part of the DAC clock cycle of its operation followed by the output of each of the other DAC cores, each during a later part of the DAC clock cycle of its operation.

56. A method of digital to analog conversion comprising:
   a) presenting input data to be converted to the inputs of each of a plurality of DACs at a DAC clock rate;
   b) converting the input data presented to the inputs of a DACs at the DAC clock rate and staggered in time;
   whereby each DAC provides a DAC output for a time period equal to the time period of a DAC clock cycle, the DAC outputs being staggered in time; and,
   c) providing as an analog output at the DAC clock rate for each data conversion, an output comprising a first DAC output during a later part of its output time period, followed by the outputs of each of the other DACS, each during a later part of its output time period.

* * * * *